(12) United States Patent
Koo et al.

(10) Patent No.: US 8,410,553 B2
(45) Date of Patent: Apr. 2, 2013

(54) SEMICONDUCTOR STRUCTURE INCLUDING HIGH VOLTAGE DEVICE

(75) Inventors: Jeoung Mo Koo, Singapore (SG); Purakh Raj Verma, Singapore (SG); Sanford Chu, Singapore (SG); Chunlin Zhu, Singapore (SG); Yisuo Li, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 110 days.

(21) Appl. No.: 12/964,753

(22) Filed: Dec. 10, 2010

(65) Prior Publication Data
US 2011/0079850 A1    Apr. 7, 2011

Related U.S. Application Data

(62) Division of application No. 11/855,168, filed on Sep. 14, 2007, now Pat. No. 7,867,862.

(51) Int. Cl.
*H01L 29/78*    (2006.01)

(52) U.S. Cl. ......... 257/344; 257/E21.437; 257/E29.269; 438/298

(58) Field of Classification Search .......... 257/344, 257/E21.437, E29.269
See application file for complete search history.

(56) References Cited

U.S. PATENT DOCUMENTS
2004/0217417 A1    11/2004    Lee

*Primary Examiner* — Mamadou Diallo
(74) *Attorney, Agent, or Firm* — Horizon IP Pte. Ltd.

(57) ABSTRACT

A high voltage device includes a substrate with a device region defined thereon. A gate stack is disposed on the substrate in the device region. A channel region is located in the substrate beneath the gate stack, while a first diffusion region is located in the substrate on a first side of the gate stack. A first isolation structure in the substrate, located on the first side of the gate stack, separates the channel and the first diffusion region. The high voltage device also includes a first drift region in the substrate coupling the channel to the first diffusion region, wherein the first drift region comprises a non-uniform depth profile conforming to a profile of the first isolation structure.

20 Claims, 11 Drawing Sheets

_US 8,410,553 B2_

SEMICONDUCTOR STRUCTURE INCLUDING HIGH VOLTAGE DEVICE

CROSS-REFERENCE TO RELATED APPLICATION

This application is a Division of U.S. application entitled Semiconductor Structure Including High Voltage Device, U.S. Ser. No. 11/855,168, filed Sep. 14, 2007, the disclosure of which is herein incorporated in its entirety by this reference.

FIELD OF THE INVENTION

The present invention relates generally to high voltage semiconductor devices, and more particularly to high voltage transistors and the fabrication thereof.

BACKGROUND OF THE INVENTION

Integrated circuits (ICs) comprising many tens of thousands of devices including field effect transistors (FETs) and other devices are a cornerstone of modern microelectronic systems. With the scaling of semiconductor technology, there is a demand for high voltage (e.g. 6-40V) range devices such as high voltage transistors with minimum pitch for example in applications such as Liquid Crystal Display (LCD) driver market.

FIG. 1 is a cross-sectional view of a known high voltage NMOS transistor 100. The NMOS transistor 100 comprises a substrate 102, such as a P-type body, with shallow trench isolation (STI) structures 104 formed therein. A gate insulator 106 is provided over the substrate 102 and a gate 108 formed above a portion of the gate insulator 106.

Lightly doped N-type drift regions (110a, 110b) are formed in the substrate 102 on opposing sides of the gate 108 and in partial overlap with the gate 108. A heavily doped N-type source region 112a is formed within one of the lightly doped drift regions 110a and a heavily doped N-type drain region 112b is formed within the other lightly doped drift region 110b. The heavily doped source and drain regions (112a, 112b) are formed to a shallower depth than the lightly doped drift regions (110a, 110b). The heavily doped source and drain regions (112a, 112b) are separated from the lower edge of the gate 108 by an STI structure 104. The NMOS transistor 100 channel region 105 is located along the surface of the substrate 102 between lightly doped N-type drift regions (110a, 110b).

During the operation of high voltage transistors, a high voltage is applied to the source or drain regions (112a, 112b). The transistor's ability to withstand such high voltage application is largely dependent on the distance between the heavily doped source and drain regions (112a, 112b) and the channel region 105, also referred to as the length of the drift region. A longer drift region translates into a higher breakdown voltage. Unfortunately, it is difficult to maintain a long drift region and hence high breakdown voltage while reducing the size of the high voltage transistor.

As a result, semiconductor structures that provide high voltage transistors at decreased transistor pitch and methods for fabrication thereof are desirable.

SUMMARY OF THE INVENTION

The present invention relates to high voltage semiconductor devices. In one aspect of the invention, a high voltage device is disclosed. The high voltage device comprises a substrate with a device region defined thereon, and a gate stack disposed on the substrate in the device region. A channel region is located in the substrate beneath the gate stack, while a first diffusion region is located in the substrate on a first side of the gate stack. The high voltage device further comprises a first isolation structure in the substrate, wherein the first isolation structure is located on the first side of the gate stack separating the channel and the first diffusion region. The high voltage device also includes a first drift region in the substrate coupling the channel to the first diffusion region, wherein the first drift region comprises a non-uniform depth profile conforming to a profile of the first isolation structure.

In another aspect of the invention, a method for fabricating a high voltage device is disclosed. The method comprises providing a substrate with a device region. A first trench isolation structure is formed in the substrate in the device region. A gate stack is formed on a surface of the substrate in the device region with a channel beneath the gate stack. The gate stack has first and second opposing sides, wherein the first side is adjacent to the first trench isolation structure. A first diffusion region is formed in the substrate in the device region, wherein the first diffusion region is separated from the channel by the first trench isolation structure. A first drift region is also formed in the substrate coupling the first diffusion region to the channel, wherein the first drift region comprises a non-uniform depth conforming to a profile of the first trench isolation structure.

These and other objects, along with advantages and features of the present invention herein disclosed, will become apparent through reference to the following description and the accompanying drawings. Furthermore, it is understood that the features of the various embodiments described herein are not mutually exclusive and can exist in various combinations and permutations.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which

DESCRIPTION OF THE INVENTION

FIGS. 2A to 2I are cross-sectional views illustrating process steps for fabricating a high voltage transistor according to a preferred embodiment of the present invention.

Figure 1:
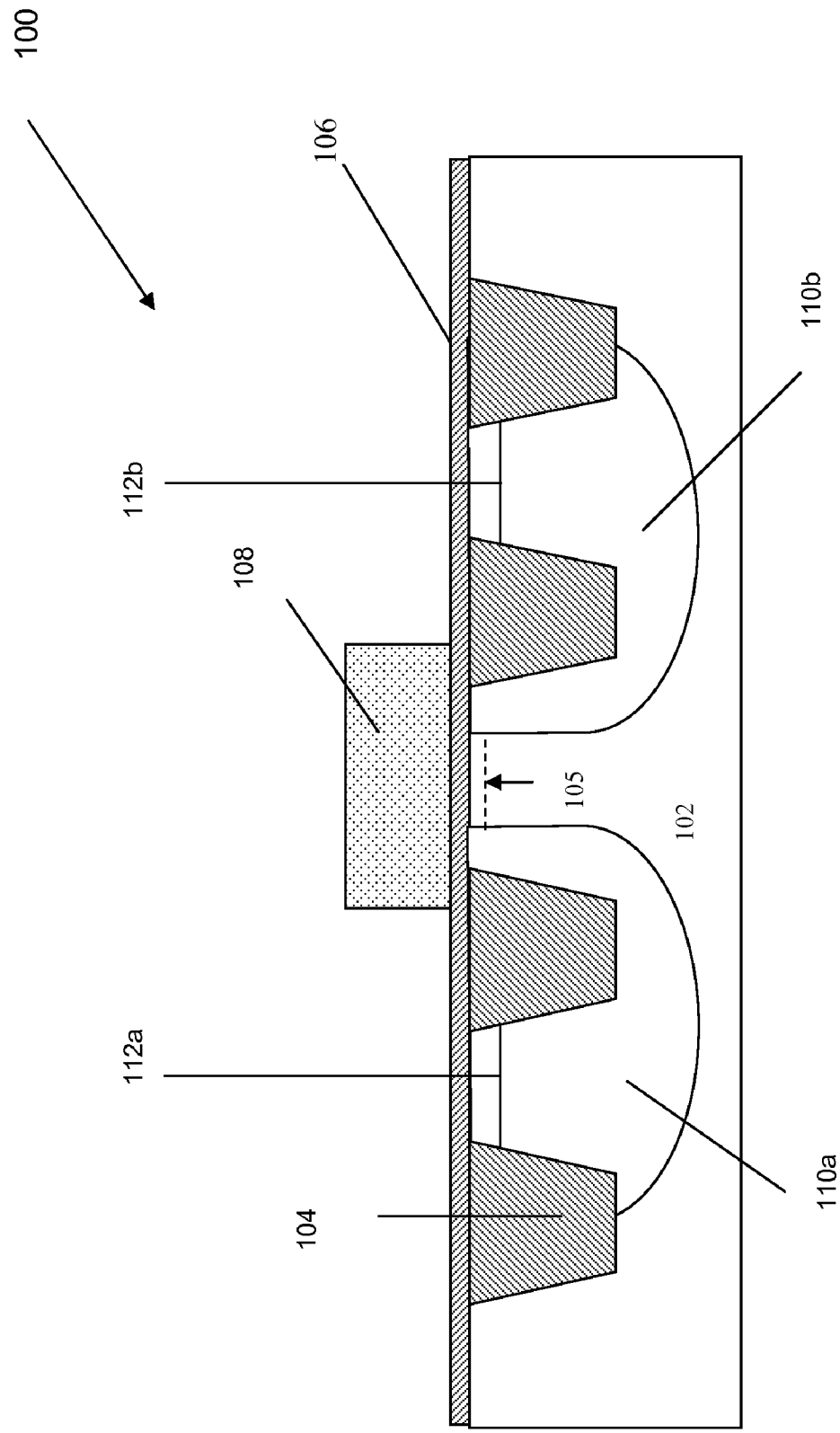
FIG. 1 is a schematic cross-sectional view of a known high voltage NMOS transistor.
Figure 2A:
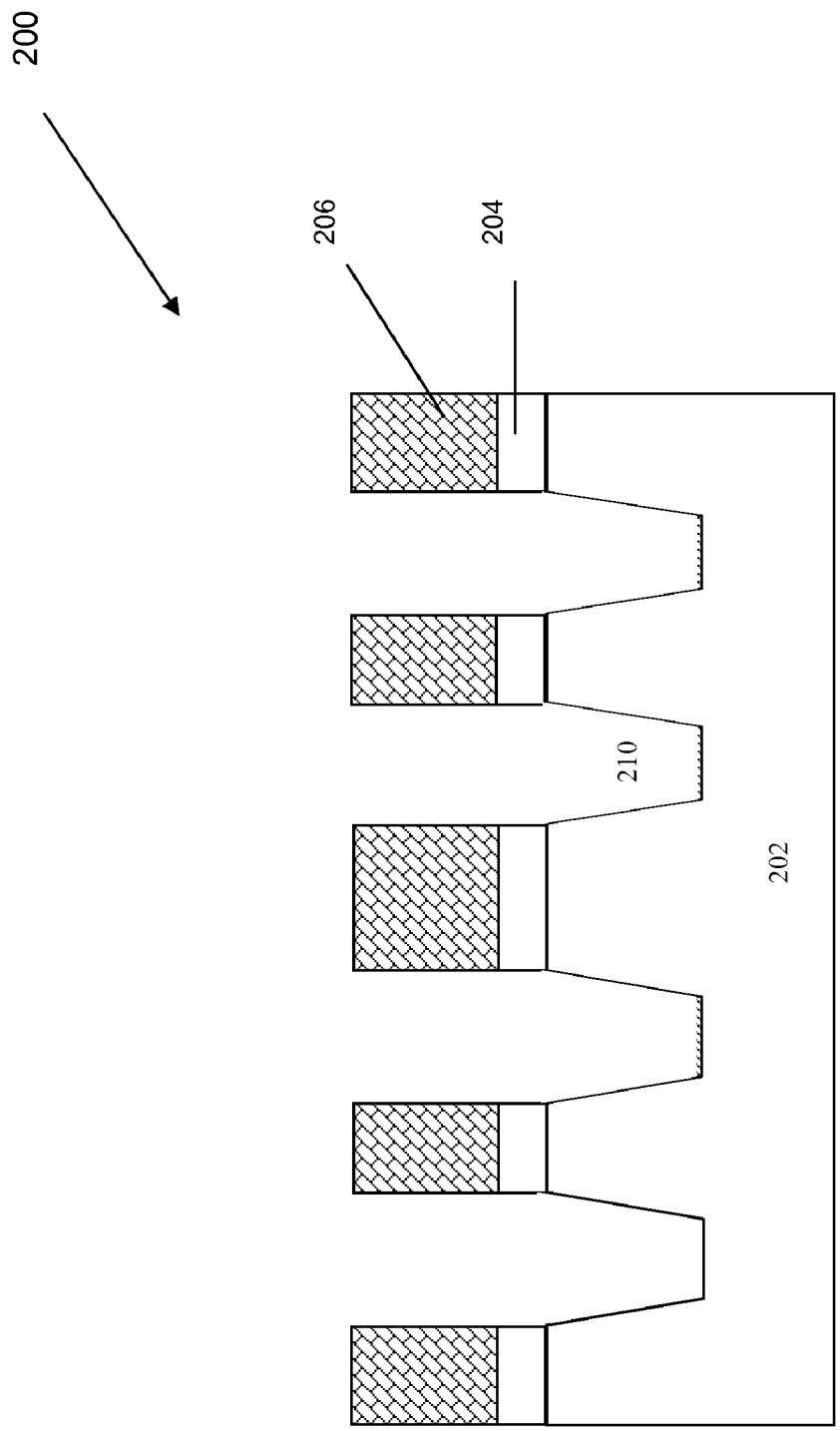
FIGS. 2A to 2I are schematic cross-sectional views illustrating the results of progressive stages in fabricating a high voltage transistor in accordance with a preferred embodiment of the invention.
Figure 2B:
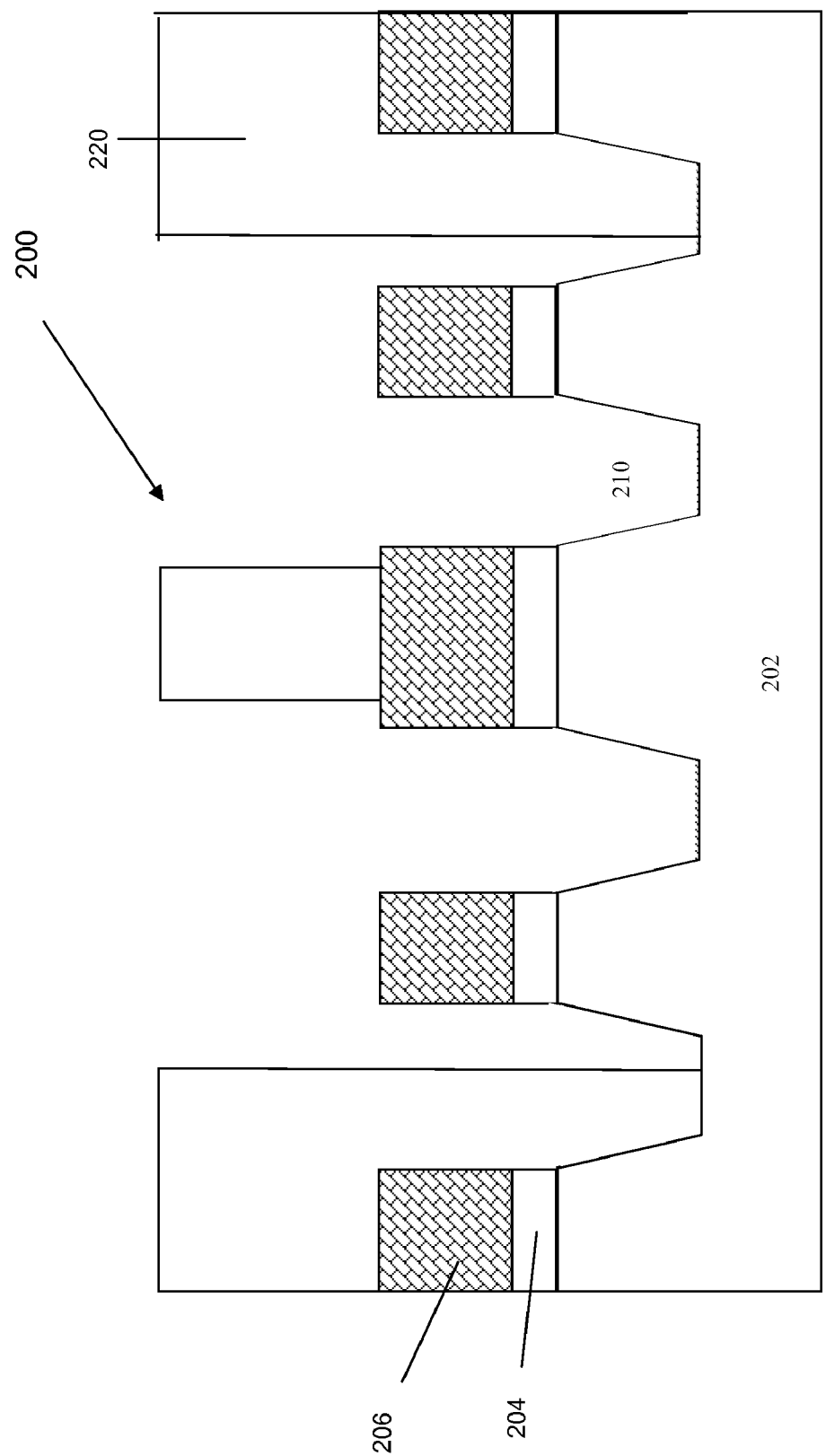
Figure 2C:
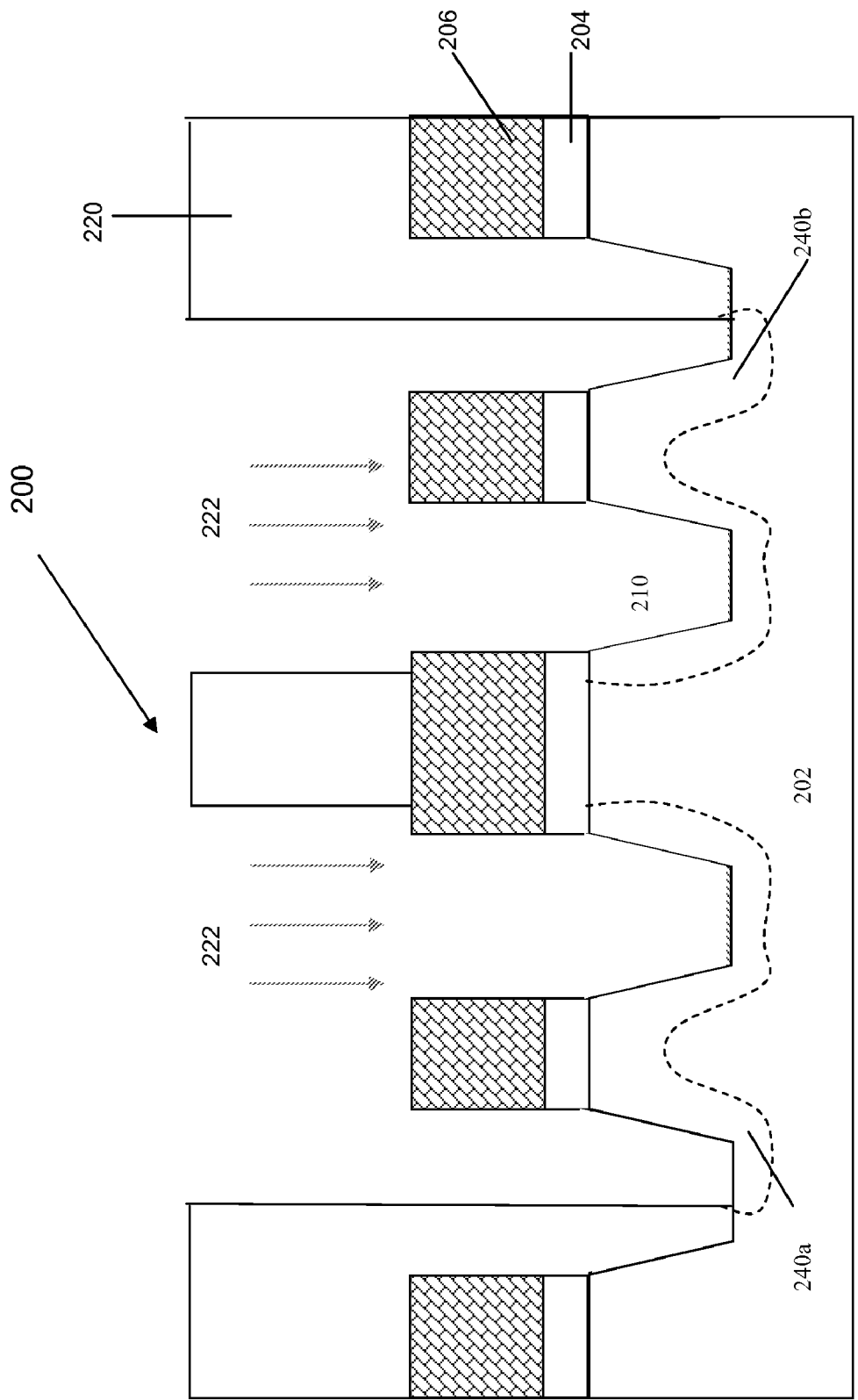
Figure 2D:
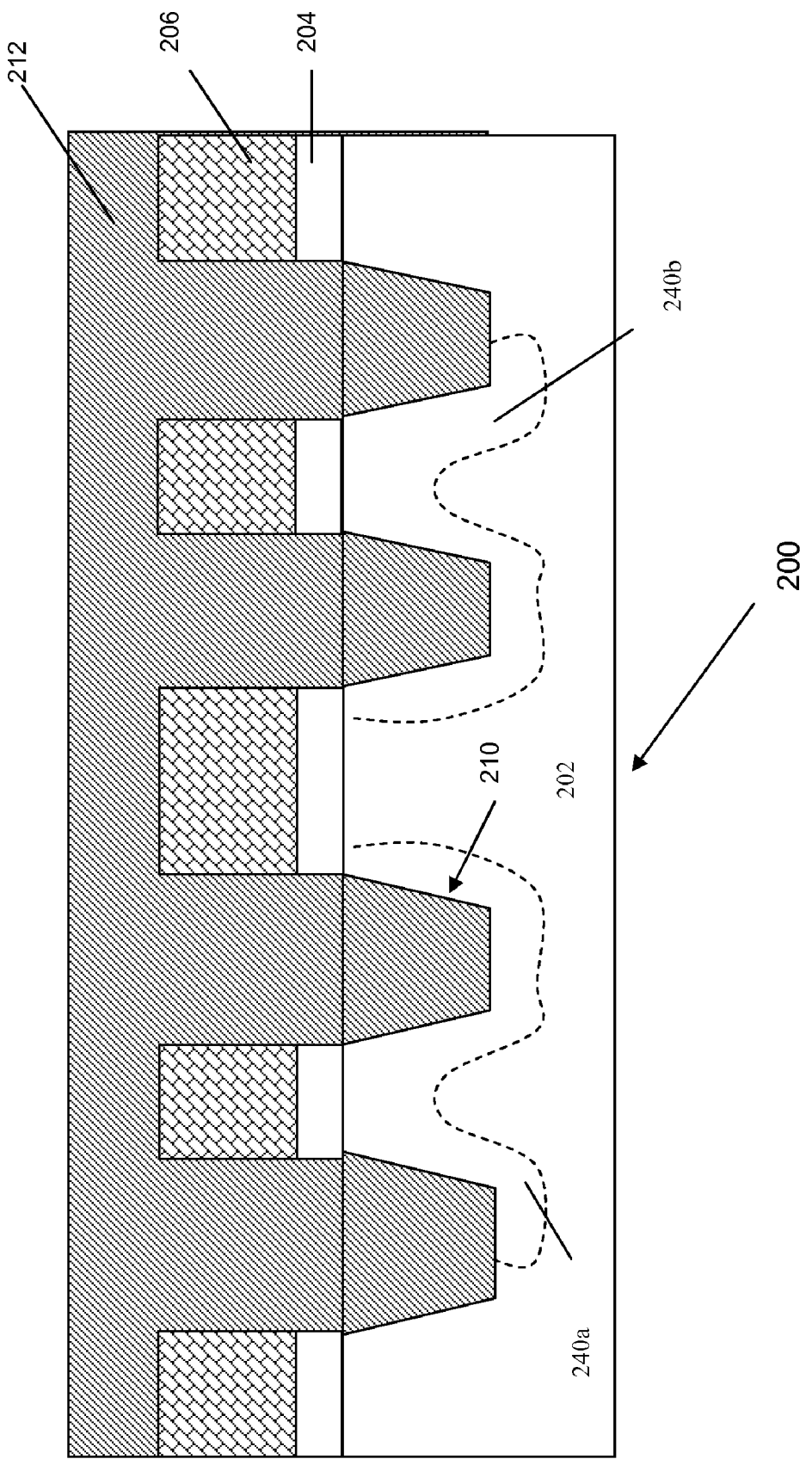
Figure 2E:
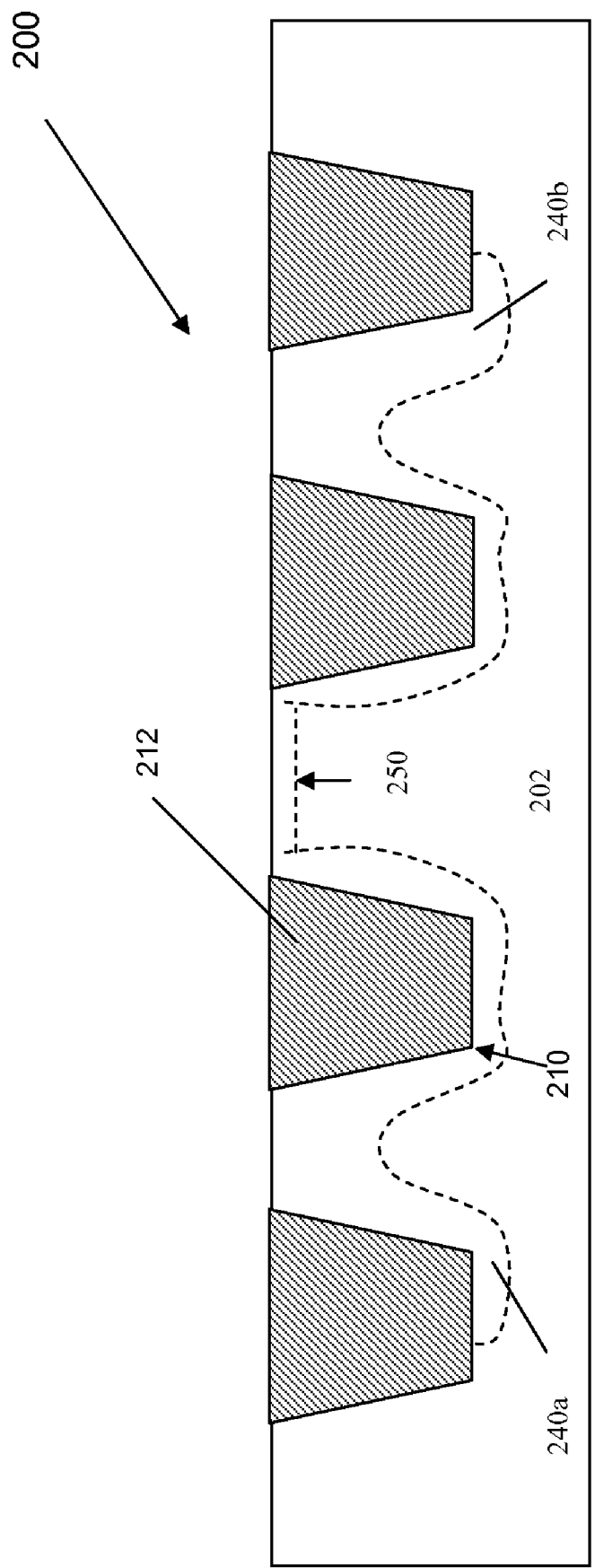
Figure 2F:
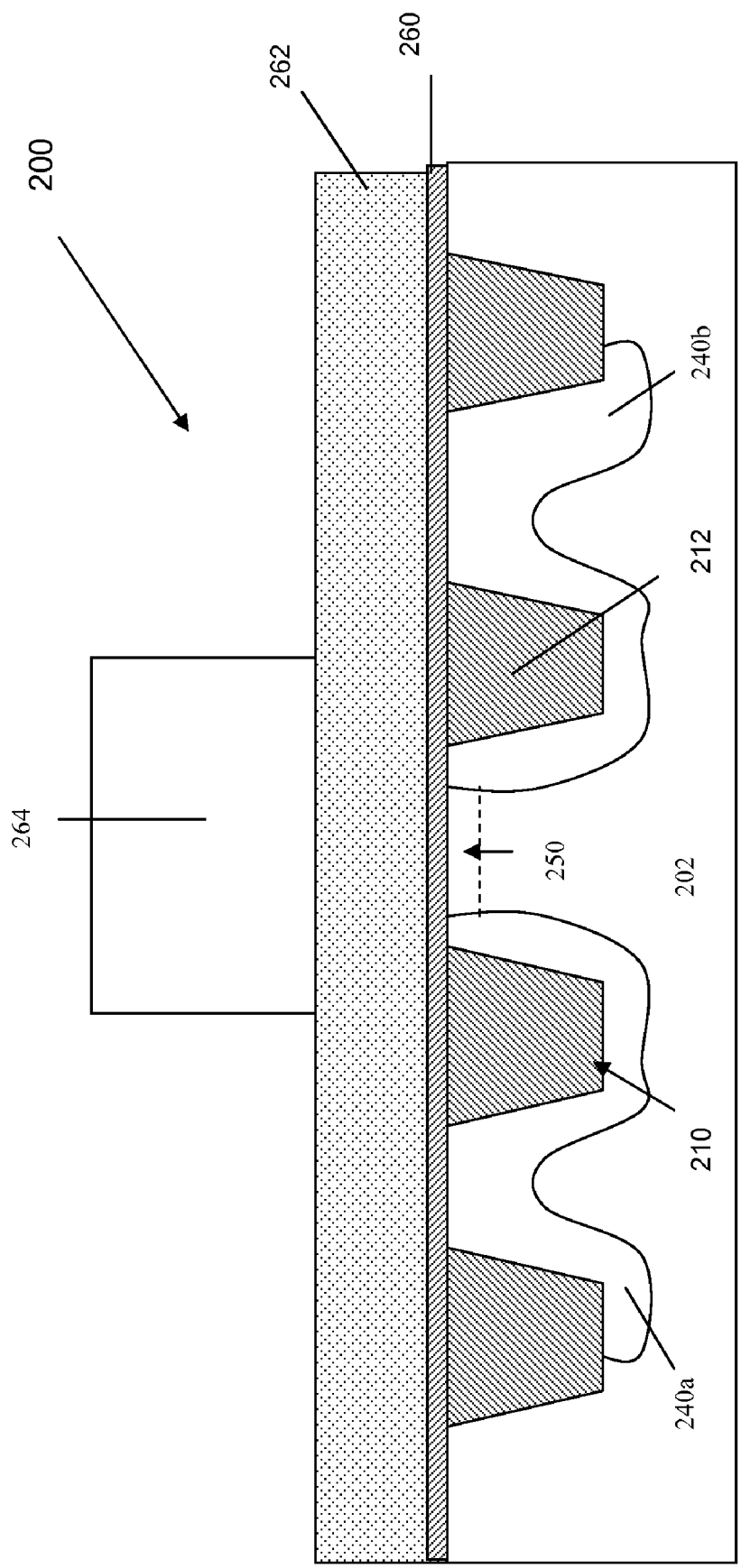
Figure 2G:
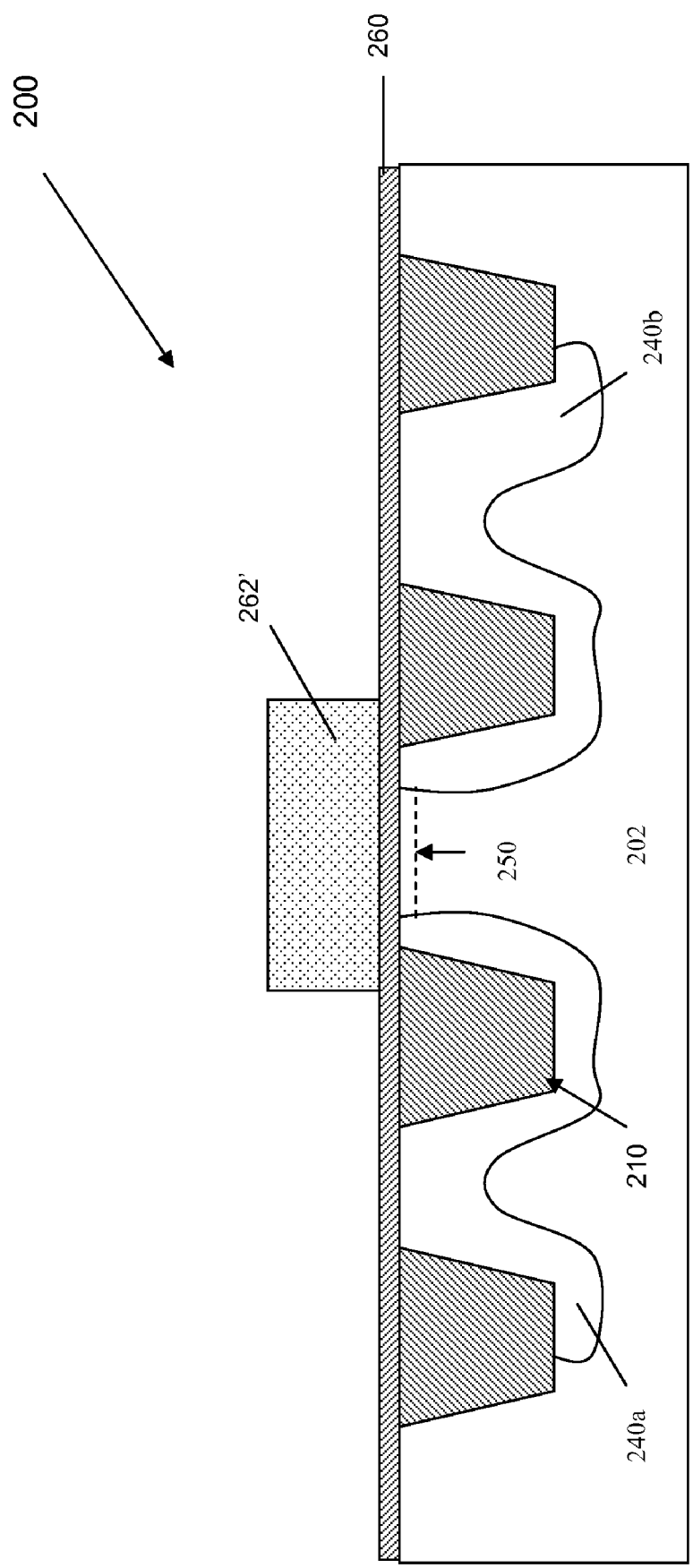
Figure 2H:
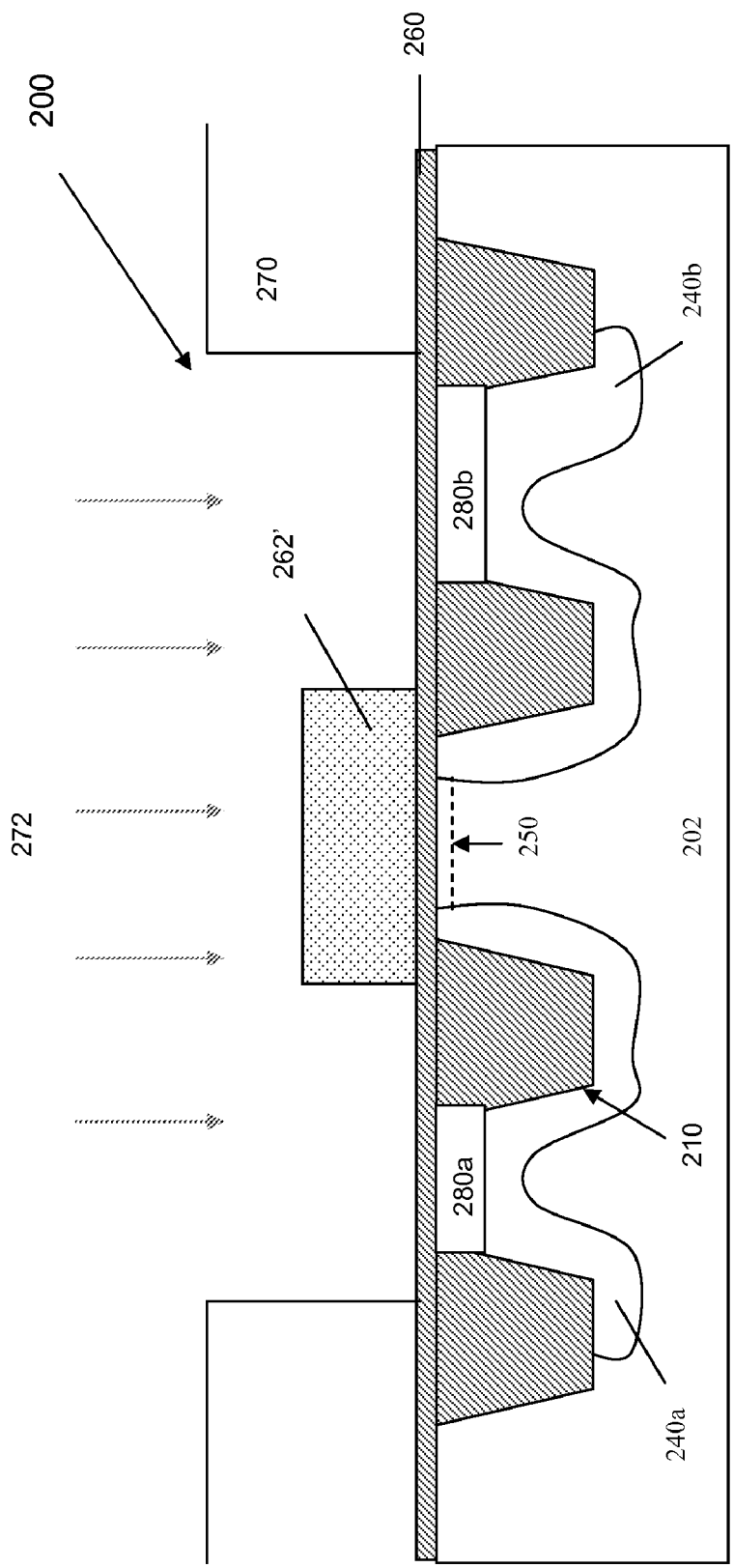
Figure 2I:
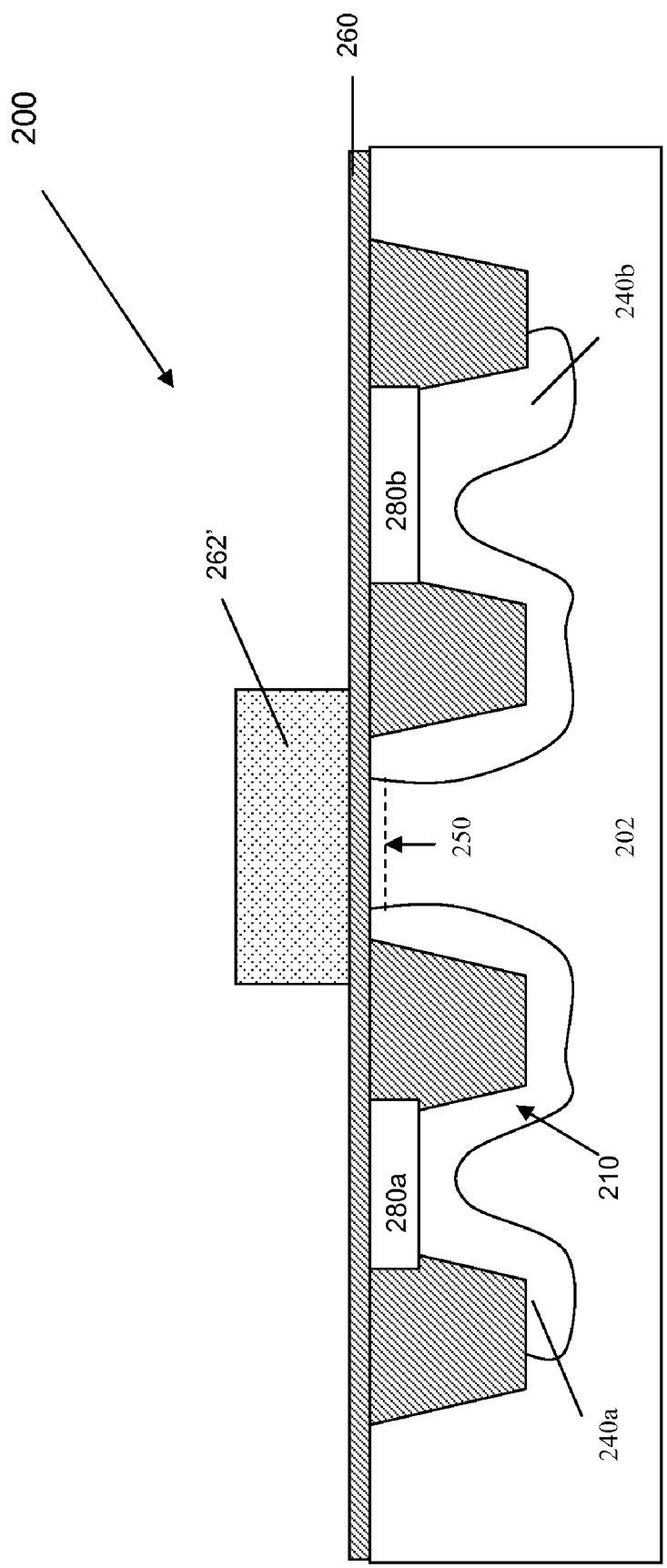

As shown in FIG. 2I, a high voltage transistor 200 according to a preferred embodiment of the invention comprises a substrate 202 with trenches 210, such as shallow trench isolations (STIs), formed therein to provide isolation. A gate dielectric 260 is provided over the surface of the substrate 202 and a gate 262' is formed above the gate dielectric 260. Preferably, the gate dielectric 260 extends beyond the gate sidewalls. Extending the gate dielectric beyond the gate sidewalls can improve the process margin by, for example, preventing undercutting of the gate dielectric 260 during subsequent processing. Providing a gate dielectric having edges in-line with the gate sidewalls is also useful.

Lightly doped first and second drift regions (240a, 240b) are formed within the substrate on opposite sides of the gate. Preferably, the first and second drift regions are in partial overlap with the gate. The channel region 250 of the transistor is between the first and second drift regions (240a, 240b) along the surface of the substrate 202. Isolating the drift and source/drain regions from other device regions are trenches. Preferably, the drift regions partially overlap the bottom of the trenches.

A shallower source and drain region (280a, 280b) is formed within the respective first and second drift regions (240a, 240b). Electrical contact to the drift regions (240a, 240b) can be provided at the source and drain (280a, 280b) regions. Trenches 210 located on opposite sides of the gate 262' separate the source/drain regions (280a, 280b) and the edges of the first/second drift regions. These trenches 210 increase the length of the drift region i.e. distance between the source or drain regions (280a, 280b) and the channel region 250 thus improving the voltage breakdown of the transistor. Preferably, a portion of these trenches overlap the gate 262'.

In accordance with one embodiment of the invention, the depth profile of the first and second drift regions (240a, 240b) comprises a non-uniform or variable depth profile. The variable depth profile of the drift region somewhat conforms to the profile of the sidewalls of the trenches. For example, the portion of the drift regions underlying the trenches 210 is much deeper than the portion of the drift region underlying the source and drain regions (280a, 280b). In one embodiment, drift regions can be formed at greater depths to accommodate deep sub-micron technologies without exceeding allocated thermal budget.

FIG. 2A shows a schematic cross-sectional view of the high voltage transistor 200 at an early stage of fabrication thereof in accordance with the preferred embodiment. The cross-sectional view shows a semiconductor substrate 202. A masking stack comprising of a first mask layer 204 and a second mask layer 206 is located upon the substrate 202. Other types of masking stack or masks can also be used. As is illustrated in FIG. 2A, the first and second mask layers (204, 206) are used as an etch mask for etching trenches 210 in the substrate at the regions not covered by the mask layers. The first and second mask layers 204, 206 prevent the substrate regions underlying it from being etched during the reactive ion etching (RIE) process used to form the trenches 210. As will be illustrated in the succeeding figures and paragraphs, the trenches 210 are subsequently filled to provide trench isolation structures.

Each of the foregoing semiconductor substrate 202, first mask layer 204, second mask layer 206 and trench 210 are generally conventional in the semiconductor fabrication art.

For example, the semiconductor substrate 202 comprises semiconductor material. Non-limiting examples of semiconductor materials include silicon, silicon-germanium, germanium and silicon on insulator.

The first and second mask layers 204 and 206 may comprise any masking material which is suitable to protect the silicon substrate 202 during the RIE to form the trench structures 210. Included are hard mask materials and photoresist mask materials which can be used alone or in combination. In one embodiment, the first mask layer 204 comprises a pad oxide layer and the second mask layer 206 comprises silicon nitride. The thickness of the silicon nitride layer is preferably between 700 to 1200 Å.

FIG. 2B shows the results of forming a third masking layer 220 upon the semiconductor structure of FIG. 2A. In one embodiment, the third masking layer 220 comprises photoresist mask materials. For the purposes of illustration, the succeeding drawings will describe a process of forming a high voltage N-type transistor in accordance with a preferred embodiment of the invention. However, it is to be appreciated that the present invention is equally applicable to the formation of a high voltage P-type transistor.

In one embodiment, the substrate 202 comprises a P-type body. Other types of substrates are also useful. The third masking layer 220 is selectively located to expose regions where N-type drift regions are to be formed. As shown in FIG. 2B, certain portions of the trenches 210 as well as first and second masking layers (204, 206) are not covered by the third masking layer 220. N-type drift regions are to be formed in the substrate 202 underlying these exposed regions. For a high voltage P-type transistor, the third masking layer would be selectively located to expose regions where P-type drift regions are to be formed.

FIG. 2C shows the results of implanting the semiconductor structure of FIG. 2B with first dopant ions 222 using the third masking layer 220 as a mask so that first and second drift regions (240a, 240b) are formed in the semiconductor substrate 202. Within the embodiment, the implant conditions are selected so that the first dopant ions 222 penetrate through exposed portions of the trench structures 210 and the exposed portions of the first and second masking layers (204, 206) such that current can flow through the portions of the first and second drift regions (240a, 240b) that extend below the trenches 210.

It has been discovered that the sequence of the present invention advantageously reduces the implant energy required to form drift regions extending below trench isolation structures formed in the substrate 202. As is illustrated in FIG. 2C, the drift region implantation is carried out before any material is formed in the trenches 210. This results in a reduction of drift region implant energy of around 40-50% compared to conventional processes. However, the invention is not limited as such. Within the present invention, the drift regions (240a, 240b) are formed by etching trenches 210 in the substrate and performing the drift region (240a, 240b) implant before substantially filling the trench 210 bulk with filler material. The drift region implantation can therefore be carried out with the trenches 210 partially filled. For example, in one embodiment, there may be a layer of liner oxide deposited along the sidewalls of the trenches 210 prior to the drift region implantation. However, the lower the thickness of the material present in the trench, the lower the implant energy required to form the drift region. Too high a filler material thickness results in substantially no improvement in implant energy reduction.

In the presently described embodiment, since we are forming a high voltage N-type transistor the first dopant ions 222 are lightly doped N-type impurity ions. Non-limiting examples of N-type dopants include Phosphorus, Arsenic or compounds thereof. In a preferred embodiment, the first dopant ions are Phosphorus or a compound thereof. In one embodiment, the phosphorus implant energy is less than 100 keV for an N-type transistor having a breakdown voltage between 20 to 32 V, and preferably between 70-80 keV.

For a high voltage P-type transistor, the first dopant ions 222 are lightly doped P-type impurity ions. Non-limiting examples of P-type dopants include Boron, Indium or compounds thereof. In a preferred embodiment, the first dopant ions are Boron or a compound thereof. In one embodiment, the Boron implant energy is less than 70 keV for a P-type transistor having a breakdown voltage between 20 to 32 V, and preferably less than 50 keV.

FIG. 2D shows the results of stripping the third mask layer 220 from the semiconductor structure of FIG. 2C and in turn depositing an isolation filler layer 212 on the entire surface of the semiconductor structure so that the trench structures 210 are completely filled. Non-limiting examples of materials for the isolation filler layer include oxides, nitrides, oxynitrides of silicon, as well as laminates and composites thereof. Alternatively, other isolation filler materials are also suitable. In one embodiment, a liner oxide layer (not shown) may be formed on the sidewalls of the trench structures 210 prior to depositing the isolation filler layer 212.

FIG. 2E shows the results of removing the isolation filler layer 212 outside the trenches and stripping the first and second masking layers (204, 206) from the semiconductor structure of FIG. 2D. The isolation filler layer 212 outside the trenches 210 and the first and second masking layers (204, 206) may be removed by chemical mechanical polishing. The resulting trenches filled with isolation filler material 212 serve as trench isolation structures. A channel implant to adjust the threshold voltage of the high voltage transistor channel located along the surface of the substrate 202 between the first and second drift regions (240a, 240b) may be carried out thereafter.

FIG. 2F shows the results of depositing a gate dielectric layer 260 followed by a gate layer 262 on the entire surface of the semiconductor structure of FIG. 2E. For a high voltage transistor, the gate dielectric is formed thickly to protect against high voltage applied to the gate. A photoresist mask material is deposited on the gate dielectric layer 262 and selectively patterned by lithography processes leaving a fourth mask layer 264. The fourth mask layer 264 is used as a mask for etching the gate layer 262.

FIG. 2G shows the semiconductor structure of FIG. 2F after the gate layer 262 has been etched to define the gate 262'. The gate layer 262 may be etched using conventional RIE chemistries. As is illustrated in FIG. 2G, the gate 262' overlaps the first and second drift regions (240a, 240b). Preferably, the gate 262' also overlaps the trenches 210 formed in the first and second drift regions (240a, 240b) near the gate 262'.

FIG. 2H shows the semiconductor structure of FIG. 2G after a photoresist mask material is deposited on the entire surface of the semiconductor structure and selectively patterned by lithography processes to form a fifth mask layer 270. As illustrated in FIG. 2H, second dopant ions 272 are implanted into the substrate 202 using the fifth mask layer 270 as a mask. Thus a source region 280a is formed between two adjacent trenches 210 within the first drift region 240a and a drain region 280b is formed between two adjacent trenches 210 within the second drift region 240b. The source and drain regions (280a, 280b) serve as a contact for the first and second drift regions and they have a shallower depth to the surface of the substrate 202 compared to the first and second drift regions (240a, 240b). The second dopant ions 272 are preferably highly doped and the source and drain regions (280a, 280b) preferably have a higher dopant concentration than the drift regions (240a, 240b) to provide an electrical contact area. In the presently described embodiment, the second dopant ions 272 implanted are N-type, thus forming a high voltage N-type transistor. For a high voltage P-type transistor, the second dopant ions 270 are P-type. In one embodiment (not shown), the gate dielectric may be selectively thinned at the portion overlying the intended source and drain regions (280a, 280b) prior to implantation of the second dopant ions 272 as a high gate dielectric thickness may hinder the ability to obtain a shallow source/drain junction.

FIG. 2I shows a high voltage N-type transistor in accordance with a preferred embodiment of the invention. FIG. 2I is formed by stripping the fifth mask layer 270 from the semiconductor structure of FIG. 2H. While the presently described embodiment illustrates the first and second drift regions (240a, 240b) as following the contour of the trenches 210 along its bottom wall and sidewall adjacent to the edge of the gate 262', the invention is not limited as such. For example, the invention also contemplates drift regions that stop halfway along the bottom wall.

The semiconductor structure of FIG. 2I is formed using a method that provides for etching trenches 210 in the substrate and implanting the drift regions (240a, 240b) before substantially filing the bulk region of the trench 210 with isolation filler material. This sequence of steps allows the drift region implant energy to be reduced. Reducing implant energy can be advantageous. For example, lower implant energy can reduce lateral straggle in the drift region profile. Additionally, with lower implant energy, a thinner third masking layer 220 can be employed. Generally, the thickness of the third masking layer decreases with decreasing implant energy. Typically, the third masking layer comprises photoresist mask materials. A thinner resist enhances the extent to which the lateral dimensions of the photoresist features may be shrunk. Correspondingly, by facilitating the reduction in the required photoresist thickness during drift region implant, the present invention provides a means for shrinking the required lateral dimensions of the photoresist mask and hence fabrication of high voltage transistors with reduced transistor pitch.

Additionally, to reduce overall cost and space consumption, System on Chip (SOC) designs can be used. SOC is a concept of integrating on a single chip different functions which used to be distributed over several smaller chips. One such example is the integration of high voltage devices with high density low leakage devices on the same chip. Such chips are useful in, for example, Liquid Crystal Display (LCD) applications where high density memory cells (e.g. SRAM cells) and high voltage devices used to drive the LCD drivers, power management circuits and relays are integrated on the same chip.

The conventional method of forming high voltage transistors presents a barrier to the integration of high voltage devices and high density devices because it requires high energy implants to form drift regions under STI structures. In order to repair the damage caused by the high energy implant, high temperature anneals are needed but these anneals cause junction diffusion thereby increasing the leakage of the high density devices. By reducing the drift region implant energy, the present invention reduces the thermal budget needed in the anneal and in some instances eliminates the need for a high temperature anneal to repair implant damage. This accordingly reduces the impact on the high density devices located on the same chip. In a preferred embodiment of the invention, the conventional trench isolation corner stress release thermal step universally used in both high and low voltage device fabrication is sufficient to repair the damage caused by the drift region implant, thus eliminating the need for a separate high temperature anneal.

Figure 3:
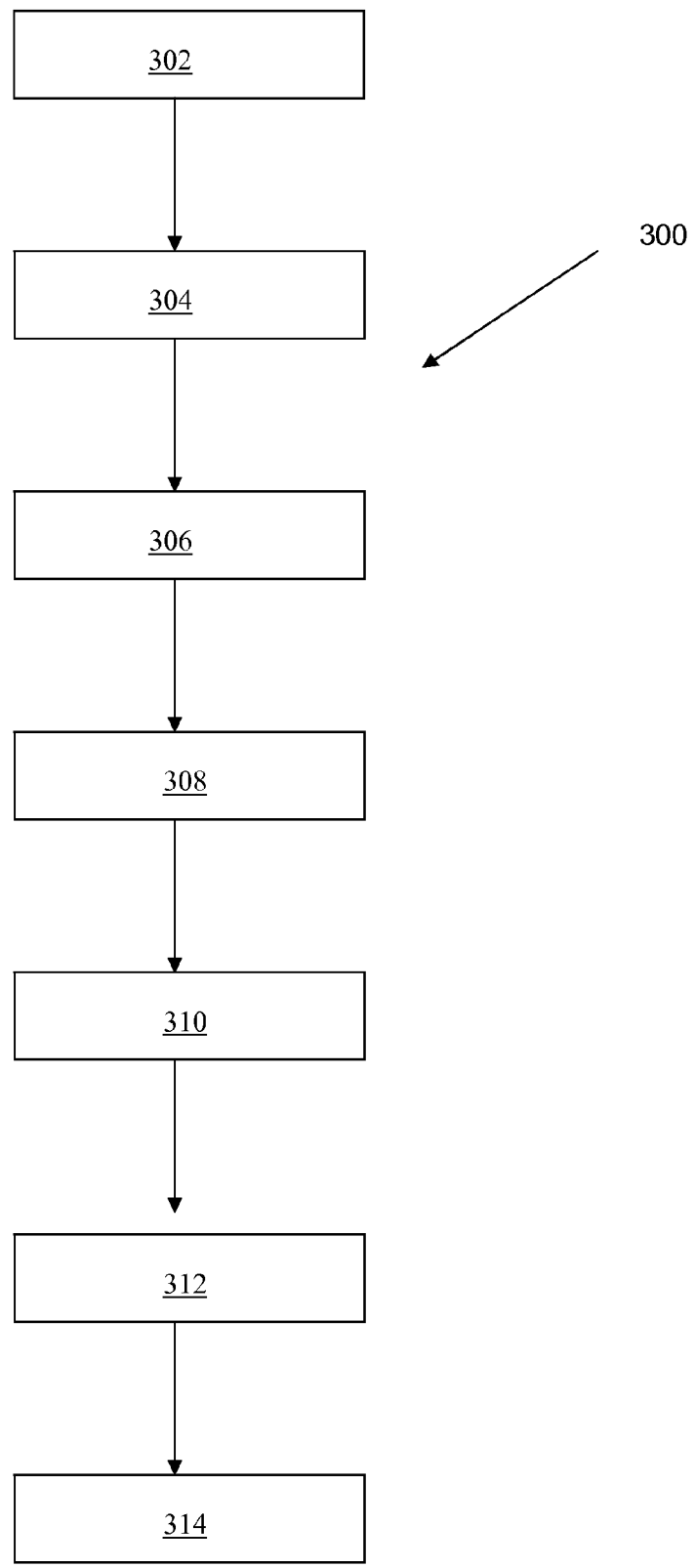
FIG. 3 is a flow chart of an integrated circuit system, for manufacturing a high voltage transistor in accordance with an embodiment of the invention.

Referring now to FIG. 3, therein is shown a flow chart of an integrated circuit system 300 for manufacturing the integrated circuit system 200 in a preferred embodiment of the present invention. The system 300 includes providing a substrate in a block 302; forming a plurality of trenches within the substrate in a block 304; forming first and second drift regions within the substrate in a block 306; filling the trenches with an isolation filler material in a block 308, the trenches with the filler isolation material forming isolation structures; forming a gate with a gate insulator over the substrate in a block 310, the first and second drift regions being located adjacent first and second opposing sides of the gate respectively; forming a source diffusion region in the first drift region in a block 312 and forming a drain diffusion region in the second drift region in a block 314.

The preferred embodiment of the invention is illustrative of the invention rather than limiting of the invention. It is to be understood that revisions and modifications may be made to methods, materials, structures and dimensions of a semiconductor structure while still providing a semiconductor that fall within the scope of the included claims. All matters hitherto set forth herein or shown in the accompanying drawings are to be interpreted in an illustrative and non-limiting sense.

What is claimed is:

1. A high voltage device comprising:
 a substrate with a device region defined thereon;
 a first isolation structure in the substrate, the first isolation structure comprising first and second opposing sidewalls and a bottom portion connecting the first and second sidewalls;
 a gate stack disposed on the substrate in the device region, the gate stack having first and second opposing sides, the first side being adjacent to the first isolation structure;
 a channel region located in the substrate beneath the gate stack;
 a first diffusion region located in the substrate, the first isolation region is separated from the channel by the first isolation structure; and
 a first drift region in the substrate coupling the channel to the first diffusion region, wherein the first drift region comprising a non-uniform depth profile conforming to the profile of the bottom portion and the first sidewall, and at least a portion of the profile of the second sidewall of the first isolation structure.

2. The high voltage device of claim 1 further comprising a first device region isolation structure located in the substrate isolating the first diffusion region from other device regions.

3. The high voltage device of claim 2 wherein the first drift region overlaps a portion of the first device region isolation structure, the non-uniform depth profile of the first drift region conforming to the profile of the first isolation structure and a profile of the first device region isolation structure.

4. The high voltage device of claim 1 wherein the first isolation structure overlaps the first side of the gate stack.

5. The high voltage device of claim 4 further comprising a first device region isolation structure located in the substrate isolating the first diffusion region from other device regions.

6. The high voltage device of claim 5 wherein the first drift region overlaps a portion of the first device region isolation structure, the non-uniform depth profile of the first drift region conforming to the profile of the first isolation structure and a profile of the first device region isolation structure.

7. The high voltage device of claim 1 wherein a portion of the first drift region underlying the first diffusion region is deeper than a depth of the first diffusion region.

8. The high voltage device of claim 7 further comprising a first device region isolation structure located in the substrate isolating the first diffusion region from other device regions, wherein the first drift region overlaps a portion of the first device isolation structure, the non-uniform depth profile of the first drift region conforming to the profile of the first isolation structure and a profile of the first device region isolation structure.

9. The high voltage device of claim 1 further comprising:
 a second diffusion region located in the substrate on a second side of the gate stack;
 a second isolation structure in the substrate, the second isolation structure located on the second side of the gate separating the channel and the second diffusion region; and
 a second drift region in the substrate coupling the channel to the second diffusion region, the second drift region comprising a non-uniform depth profile conforming to a profile of the second isolation structure.

10. The high voltage device of claim 9 further comprising a second device region isolation structure located in the substrate isolating the second diffusion region from other device regions, wherein the second drift region overlaps a portion of the second device region isolation structure, the non-uniform depth profile of the second drift region conforming to the profile of the second isolation structure and a profile of the second device region isolation structure.

11. The high voltage device of claim 9 wherein the second isolation structure overlaps the second side of the gate stack.

12. The high voltage device of claim 11 further comprising a second device region isolation structure located in the substrate isolating the second diffusion region from other device regions, wherein the second drift region overlaps a portion of the second device region isolation structure, the non-uniform depth profile of the second drift region conforming to the profile of the second isolation structure and a profile of the second device region isolation structure.

13. The high voltage device of claim 9 wherein a portion of the non-uniform depth profile of the second drift region is deeper than the second diffusion region.

14. The high voltage device of claim 13 further comprising a second device region isolation structure located in the substrate isolating the second diffusion region from other device regions, wherein the second drift region overlaps a portion of the second device region isolation structure, the non-uniform depth profile of the second drift region conforming to the profile of the second isolation structure and a profile of the second device region isolation structure.

15. The high voltage device of claim 7 wherein a portion of the first drift region underlying a base of the first isolation structure is deeper than the portion of the first drift region underlying the first diffusion region.

16. The high voltage device of claim 11 wherein a portion of the second drift region underlying a base of the second isolation structure is deeper than the portion of the second drift region underlying the second diffusion region.

17. A high voltage device comprising:
 a substrate with a device region;
 a first isolation structure in the substrate within the device region, the first isolation structure comprising first and second opposing sidewalls and a bottom portion connecting the first and second sidewalls;
 a first doped region in the substrate in the device region, wherein the first doped region comprises a non-uniform depth conforming to the profile of the bottom portion and the first sidewall, and at least a portion of the profile of the second sidewall of the first isolation structure.

18. The high voltage device of claim 17 further comprising:
 a gate stack disposed on the substrate in the device region, the gate stack having first and second opposing sides, the first side being adjacent to the first isolation structure; and
 a channel region located in the substrate beneath the gate stack.

19. The high voltage device of claim 18 further comprising a first diffusion region in the substrate adjacent to the first isolation structure, wherein the first diffusion region is separated from the channel by the first isolation structure.

20. The high voltage device of claim 19 wherein a portion of the first doped region underlying a base of the first isolation structure is deeper than the portion of the first doped region underlying the first diffusion region.

* * * * *